US012368277B1

(12) United States Patent
Jia

(10) Patent No.: US 12,368,277 B1
(45) Date of Patent: Jul. 22, 2025

(54) SYSTEMS AND METHODS FOR FREE SPACE OPTICAL INJECTION LOCKING

(71) Applicant: CABLE TELEVISION LABORATORIES, INC., Louisville, CO (US)

(72) Inventor: Zhensheng Jia, Superior, CO (US)

(73) Assignee: Cable Television Laboratories, Inc., Louisville, CO (US)

(*) Notice: Subject to any disclaimer, the term of this patent is extended or adjusted under 35 U.S.C. 154(b) by 559 days.

(21) Appl. No.: 17/703,886

(22) Filed: Mar. 24, 2022

Related U.S. Application Data

(60) Provisional application No. 63/140,883, filed on Jan. 24, 2021.

(51) Int. Cl.
*H01S 3/094* (2006.01)
*H01S 5/40* (2006.01)
*H04B 10/50* (2013.01)

(52) U.S. Cl.
CPC .. *H01S 3/094053* (2013.01); *H01S 3/094026* (2013.01); *H01S 5/4006* (2013.01); *H04B 10/503* (2013.01)

(58) Field of Classification Search
CPC ..... H01S 5/4006; H01S 5/4068; H01S 5/0656
See application file for complete search history.

(56) References Cited

U.S. PATENT DOCUMENTS

| 4,677,629 A * | 6/1987 | Lesh | H01S 5/4006 372/18 |
|---|---|---|---|
| 4,755,016 A * | 7/1988 | DeLoach, Jr. | H01S 5/4006 372/18 |
| 5,379,309 A | 1/1995 | Logan, Jr. | |
| 7,627,249 B1 | 12/2009 | Izadpanah et al. | |
| 8,615,028 B1 * | 12/2013 | Sayyah | H01S 5/423 372/50.12 |
| 9,880,351 B2 * | 1/2018 | Chien | G02B 6/105 |
| 10,613,410 B2 * | 4/2020 | Hosseini | G02F 1/292 |
| 10,944,478 B2 * | 3/2021 | Zhang | H04B 10/532 |
| 11,112,310 B2 * | 9/2021 | Anandarajah | G01J 3/427 |

(Continued)

FOREIGN PATENT DOCUMENTS

| WO | 0232020 A1 | 4/2002 | |
|---|---|---|---|
| WO | WO-2019122369 A1 * | 6/2019 | G01J 3/0218 |
| WO | WO-2021224485 A1 * | 11/2021 | G01J 3/10 |

OTHER PUBLICATIONS

Althunibat et al., "A hybrid free space optical-millimeter wave cooperative system," Optics Communications, vol. 453, (2019) 124400, Aug. 17, 2019, pp. 1-11 (Year: 2019).

(Continued)

*Primary Examiner* — Joshua King
(74) *Attorney, Agent, or Firm* — Josh C. Snider; Snider IP

(57) ABSTRACT

An optical emission array includes an optical input portion configured to provide a parent laser source for the optical emission array, and an optical output portion including a plurality of child laser emitters. Each child laser emitter of the plurality of child laser emitters is injection-locked to the parent laser source. The optical emission array further includes at least two optical distribution branches (i) disposed between the optical input portion and the optical output portion, and (ii) optically connecting at least two child laser emitters of the plurality of child laser emitters, respectively, to the parent laser source.

20 Claims, 4 Drawing Sheets

(56) References Cited

U.S. PATENT DOCUMENTS

| | | | | |
|---|---|---|---|---|
| 11,418,263 | B2* | 8/2022 | Zhang | G02B 27/286 |
| 2001/0004290 | A1* | 6/2001 | Lee | H04B 10/502 |
| | | | | 398/79 |
| 2002/0122230 | A1 | 9/2002 | Izadpanah et al. | |
| 2003/0103534 | A1* | 6/2003 | Braiman | H01S 5/4006 |
| | | | | 372/10 |
| 2004/0101317 | A1* | 5/2004 | Yap | H01S 5/4006 |
| | | | | 398/187 |
| 2004/0146296 | A1 | 7/2004 | Gerszberg et al. | |
| 2004/0264977 | A1 | 12/2004 | Yap et al. | |
| 2006/0114955 | A1* | 6/2006 | Steckman | H01S 5/4062 |
| | | | | 372/98 |
| 2006/0239312 | A1* | 10/2006 | Kewitsch | H01S 5/42 |
| | | | | 372/29.016 |
| 2006/0280209 | A1* | 12/2006 | Treusch | H01S 5/4062 |
| | | | | 372/32 |
| 2007/0002925 | A1* | 1/2007 | Zediker | H01S 5/4062 |
| | | | | 372/98 |
| 2009/0180502 | A1* | 7/2009 | Byun | H04B 10/506 |
| | | | | 359/344 |
| 2010/0046003 | A1* | 2/2010 | Le Floch | H01S 5/4068 |
| | | | | 356/486 |
| 2010/0303111 | A1* | 12/2010 | Kupershmidt | H01S 5/14 |
| | | | | 372/32 |
| 2011/0052114 | A1* | 3/2011 | Bernasconi | H01S 5/026 |
| | | | | 438/31 |
| 2011/0142451 | A1 | 6/2011 | Shi et al. | |
| 2011/0150502 | A1* | 6/2011 | Zhao | H01S 5/065 |
| | | | | 398/183 |
| 2011/0304853 | A1* | 12/2011 | Yamada | H01S 5/14 |
| | | | | 372/20 |
| 2012/0251129 | A1* | 10/2012 | Delfyett | H01S 5/0656 |
| | | | | 398/188 |
| 2014/0177661 | A1* | 6/2014 | Tanaka | H01S 5/141 |
| | | | | 372/25 |
| 2014/0314368 | A1* | 10/2014 | Chien | H04B 10/532 |
| | | | | 385/11 |
| 2018/0191428 | A1 | 7/2018 | Hemmati et al. | |
| 2018/0269972 | A1 | 9/2018 | Djordjevic et al. | |
| 2019/0326995 | A1* | 10/2019 | Zhou | H04B 10/64 |
| 2019/0393962 | A1* | 12/2019 | Zhang | H01S 5/0657 |
| 2021/0036484 | A1* | 2/2021 | Maker | H01S 3/1305 |
| 2022/0057641 | A1* | 2/2022 | Hoefler | H01S 5/1246 |

OTHER PUBLICATIONS

Dat et al., "Hybrid FSO/MMW system for high-speed and reliable mobile fronthaul system," ECOC 2019, Sep. 22-26, 2019, pp. 1-4 (Year: 2019).

McKenna et all, "Hybrid Millimeter-Wave/Free-Space Optical System for High Data Rate Communications," 2013 IEEE Photonics Conference (IPC), papger TcC3.2 (Year: 2013).

Touati et all, "On the Effects of Combined Atmospheric Fading and Misalignment on the Hybrid FSO/RF Transmission," J. Opt Commun. Netw. vol. 8, No. 10, Oct. 2016, pp. 715-725 (Year: 2016).

Zhang et al., "Fiber-wireless integrated mobile backhaul network based on a hybrid millimeter-wave and free-space-optics architecture with an adaptive diversity combining technique," Optics Letter, vol. 41, No. 9, May 1, 2016, pp. 1909-1912 (Year: 2016).

Zhao et al., "Hybrid FSO/MMW Communication System with Active Link Switching based on Weather Conditions," 2021 Asia Communications and Photonics Conference (ACP), Oct. 24-27, 2021 (Year: 2021).

\* cited by examiner

SYSTEMS AND METHODS FOR FREE SPACE OPTICAL INJECTION LOCKING

CROSS REFERENCE TO RELATED APPLICATIONS

This application claims the benefit of and priority to U.S. Provisional Application No. 63/140,883, filed Jan. 24, 2021, which is incorporated herein by reference in its entirety.

BACKGROUND

The field of the disclosure relates generally to optical communication networks, and more particularly, to optical networks utilizing optical injection locking techniques.

Some conventional point-to-point (P2P) telecommunication networks include two transceivers at opposing ends of a "wired" communication line (e.g., fiber, coaxial, hybrid fiber-coaxial (HFC), etc.). Conventional point-to-multipoint (P2MP) telecommunication networks often include a service provider hub or headend to which a plurality of end user subscribers connect. Bandwidth requirements for delivering high-speed data and video services through such networks are rapidly increasing to meet growing consumer demands. Many such conventional networks are now based on passive optical network (PON) technologies, which have become a dominant system architecture to meet the growing high capacity demand from P2P and P2MP end users.

Some conventional optical communication systems implement free space optics (FSO) in place of at least some of the "wired" transport media of the system. That is, different from many legacy wired networks, in an FSO communication system, free space and/or air acts as the medium between an opposing optical transmitter and optical receiver, which should be in a line of sight of one another for successful transmission of the optical signal. Such a conventional FSO solution is described further below with respect to FIG. 1. It should be noted that, although FSO transport is sometimes referred to as "wireless" transport, FSO transport is entirely optical between respective transmitters and receivers, and should be differentiated from conventional electromagnetic radio frequency (RF) wireless communications over RF bands (e.g., Wi-Fi, long term evolution (LTE), etc.).

FIG. 1 is a schematic illustration depicting a conventional FSO transmission scheme 100 for one-way optical transmission over an FSO communication medium 102. Scheme 100 includes an optical transmitter 104 and an optical receiver 106 disposed across FSO communication medium 102, and within line of sight of one another. FSO system communications according to scheme 100 utilize modulated optical and/or laser beams to send telecommunication information through the atmosphere of FSO communication medium 102.

More particularly, optical transmitter 104 includes a transmitting optical source 108 (e.g., a laser diode) in communication with a modulator 110, which modulates an electrical signal input 112 (e.g., a data signal) onto the optical/laser beam from transmitting optical source 108. An optical output portion 114 (e.g., optical coupler, passive optical elements, etc.) then transmits the modulated beam from modulator 110 then across FSO communication medium 102 to optical receiver 106. At optical receiver 106, the modulated beam is received at an optical input portion 116 (e.g., optical coupler, passive optical elements, etc.), which feeds the received modulated beam to a photodetector 118, which converts the received modulated beam into a received electrical signal. The received electrical signal is amplified by an amplifier 120 (e.g., a transimpedance amplifier, or TIA), which produces an electrical signal output 122.

For ease of explanation, scheme 100 is depicted with respect to one-way communication across FSO communication medium 102. Where bidirectional capability is desired, at least one optical transceiver may be disposed at each end of communication medium 102. Respective transmitting and receiving portions of such conventional optical transceivers operate according to the general principles described with respect to scheme 100.

However, conventional FSO solutions that utilize this single-transmitter and single-aperture receiver architecture are known to realize a significant probability of deep fades. To reduce the deep fade probability, and also to improve emission and detection efficiency, multiple transmitters and receivers have been recently proposed in an array. Such array-based proposals are of particular interest with respect to newer coherent optics technologies since, in a coherent optic system, an inherent coherent gain is realized when the spatial field of the received signal matches that of the local oscillator (LO), thereby providing improved background noise rejection, as well as spatial and frequency selectivity.

However, the laser source remains one of the highest-cost elements in coherent optical transceiver structure, which has rendered such recent array-based FSO proposals cost-prohibitive for practical implementation. Typical coherent optics communication systems use an external cavity laser (ECL), which generate a relatively narrower linewidth (e.g., approximately 50-500 kHz in range) for coherent system needs. An ECL has a reflector that creates a cavity outside of a gain chip, thereby enabling the cavity to have an effectively greater length than if confined to the gain chip. By adding this external cavity to the gain medium semiconductor structure of the chip, a very fine single-frequency linewidth emission condition may be imposed. Nevertheless, ECL implementation remains very costly, and is particularly complicated for rural FSO applications. In contrast, Fabry-Perot (FP) lasers, or FP laser diodes (FP-LD), are comparatively simple and low-cost light sources. FP lasers, however, are generally confined to lower-data rate applications over short-distance optical communications.

Accordingly, there is a desire in the field to provide lower-cost laser source solutions for FSO communications in both coherent and non-coherent optical systems. Moreover, conventional FSO technologies require both electrical-to-optical (E/O) conversion at the transmission side and optical-to-electrical (O/E) conversion at the receiver side, which significantly increase the hardware complexity to implement FSO, while also reducing the available power. There is thus a further desire to simplify the hardware complexity and maximize available transmission power.

SUMMARY

In an embodiment, an optical emission array includes an optical input portion configured to provide a parent laser source for the optical emission array, and an optical output portion including a plurality of child laser emitters. Each child laser emitter of the plurality of child laser emitters is injection-locked to the parent laser source. The optical emission array further includes at least two optical distribution branches (i) disposed between the optical input portion and the optical output portion, and (ii) optically connecting at least two child laser emitters of the plurality of child laser emitters, respectively, to the parent laser source.

BRIEF DESCRIPTION

These and other features, aspects, and advantages of the present disclosure will become better understood when the following detailed description is read with reference to the accompanying drawings in which like characters represent like parts throughout the drawings, wherein.

Figure 1:
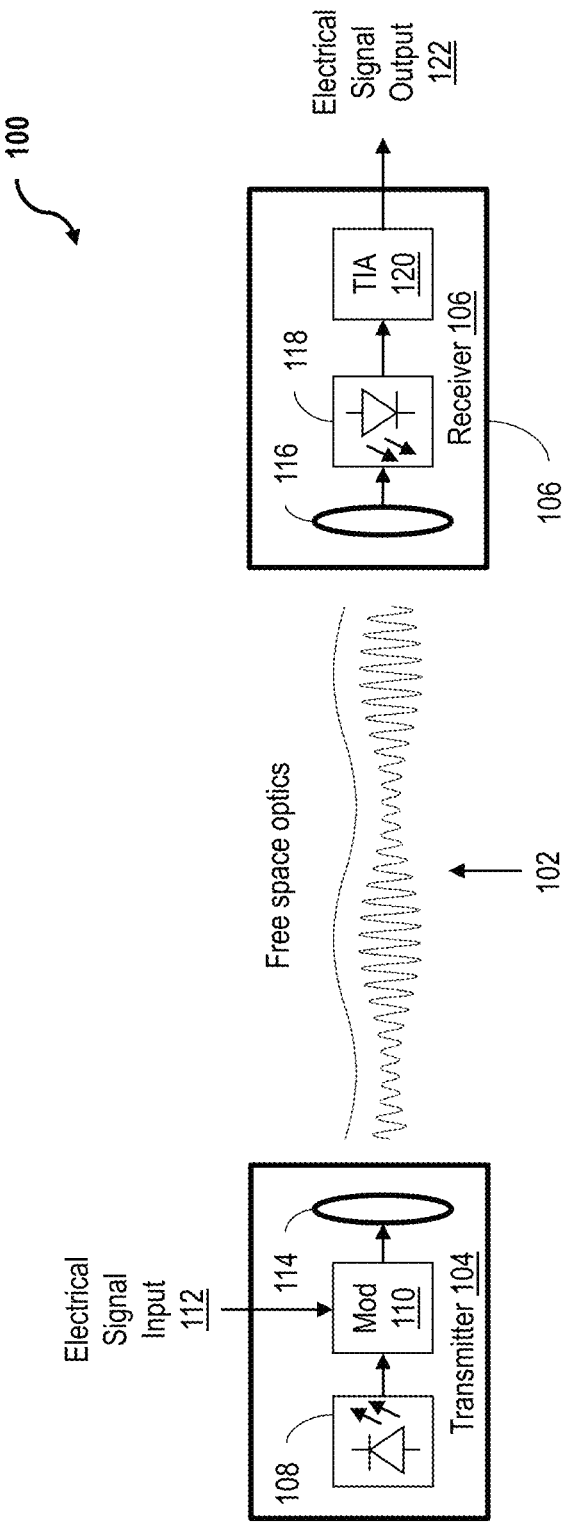
FIG. 1 is a schematic illustration depicting a conventional FSO transmission scheme for one-way optical transmission over an FSO communication medium.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the term "database" may refer to either a body of data, a relational database management system (RDBMS), or to both, and may include a collection of data including hierarchical databases, relational databases, flat file databases, object-relational databases, object oriented databases, and/or another structured collection of records or data that is stored in a computer system.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, servers, and respective processing elements thereof.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

As described herein, "user equipment," or UE, refers to an electronic device or system utilizing a wireless technology protocol, such as Long Term Evolution (LTE) or WiMAX (e.g., IEEE 802.16 protocols), and may include therein Wi-Fi capability to access and implement one or more existing IEEE 802.11 protocols. A UE may be fixed, mobile, or portable, and may include a transceiver or transmitter-and-receiver combination. A UE may have separate components, or may be integrated as a single device that includes a media access control (MAC) and physical layer (PHY) interface, both of which may be 802.11-conformant and/or 802.16-conformant to a wireless medium (WM).

As used herein, "modem termination system" (MTS) refers to a termination unit including one or more of an Optical Network Terminal (ONT), an optical line termination (OLT), a network termination unit, a satellite termination unit, a cable modem termination system (CMTS), and/or other termination systems which may be individually or collectively referred to as an MTS.

As used herein, "modem" refers to a modem device, including one or more a cable modem (CM), a satellite modem, an optical network unit (ONU), a DSL unit, etc., which may be individually or collectively referred to as modems.

As used herein, the term "coherent transceiver," unless specified otherwise, refers to a P2P or P2MP coherent optics transceiver having a coherent optics transmitting portion and a coherent optics receiving portion. In some instances, the transceiver may refer to a specific device under test (DUT) for several of the embodiments described herein.

As described herein, a "PON" generally refers to a passive optical network or system having components labeled according to known naming conventions of similar elements that are used in conventional PON systems. For example, an OLT may be implemented at an aggregation point, such as a headend/hub, and multiple ONUs may be disposed and operable at a plurality of end user, customer premises, or subscriber locations. Accordingly, an "uplink transmission" refers to an upstream transmission from an end user to a headend/hub, and a "downlink transmission" refers to a downstream transmission from a headend/hub to the end user, which may be presumed to be generally broadcasting continuously (unless in a power saving mode, or the like).

The person of ordinary skill in the art will understand that the term "wireless," as used herein in the context of optical transmission and communications, including free space optics (FSO), generally refers to the absence of a substantially physical transport medium, such as a wired transport, a coaxial cable, or an optical fiber or fiber optic cable.

As used herein, the term "data center" generally refers to a facility or dedicated physical location used for housing electronic equipment and/or computer systems and associated components, e.g., for communications, data storage, etc. A data center may include numerous redundant or backup components within the infrastructure thereof to provide power, communication, control, and/or security to the multiple components and/or subsystems contained therein. A physical data center may be located within a single housing facility, or may be distributed among a plurality of co-located or interconnected facilities. A 'virtual data center' is a non-tangible abstraction of a physical data center in a software-defined environment, such as software-defined networking (SDN) or software-defined storage (SDS), typically operated using at least one physical server utilizing a hypervisor. A data center may include as many as thousands of physical servers connected by a high-speed network.

As used herein, the term "hyperscale" refers to a computing environment or infrastructure including multiple computing nodes, and having the capability to scale appropriately as increased demand is added to the system, i.e., seamlessly provision infrastructure components and/or add computational, networking, and storage resources to a given node or set of nodes. A hyperscale system, or "hyperscaler" may include hundreds of data centers or more, and may include distributed storage systems. A hyperscale system may utilize redundancy-based protection and/or erasure coding, and may be typically configured to increase background load proportional to an increase in cluster size. A hyperscale node may be a physical node or a virtual node, and multiple virtual nodes may be located on the same physical host. Hyperscale management may be hierarchical, and a "distance" between nodes may be physical or perceptual. A hyperscale datacenter may include several performance optimized datacenters (PODs), and each POD may include multiple racks and hundreds and thousands of compute and/or storage devices."

The following embodiments describe innovative architectures and processes an FSO link using optical injection locking (OIL) technologies that significantly reduce the hardware cost of the optical transceiver. The present systems and methods further introduce innovative all-optical array designs which are of particularly value to an FSO coherent link, due to the fact that existing commercially available FSO subsystems are opto-electronic, and thus significantly more costly and complex than the preset purely optical FSO solutions.

In an exemplary embodiment, optical signal processing utilizes OIL techniques to generate a high spectral purity signal from relatively inexpensive laser diode (e.g., FPLDs), thereby enabling low-cost coherent systems based substantially on FP lasers to generate the multiple optical signals transmitted throughout the system. Innovative OIL-based solutions for coherent PON (CPON) technologies, or COIL, have been previously introduced by the present inventors, which significantly increase the receiver sensitivity and overall capacity for WDM-PON access networks, as described in U.S. Pat. No. 9,912,409, the disclosure of which is incorporated by reference herein. These previous solutions provide superior receiver sensitivities, extended power budgets, and high coherent frequency selectivities through innovative techniques that optically injection lock multiple inexpensive, lower-performance lasers (e.g., FPLDs) throughout a network to a single high-performance source laser (e.g., an ECL). The embodiments described below expand upon these earlier solutions by implementing FSO solutions to facilitate optical transport through multiple portions of the optical network.

Figure 2:
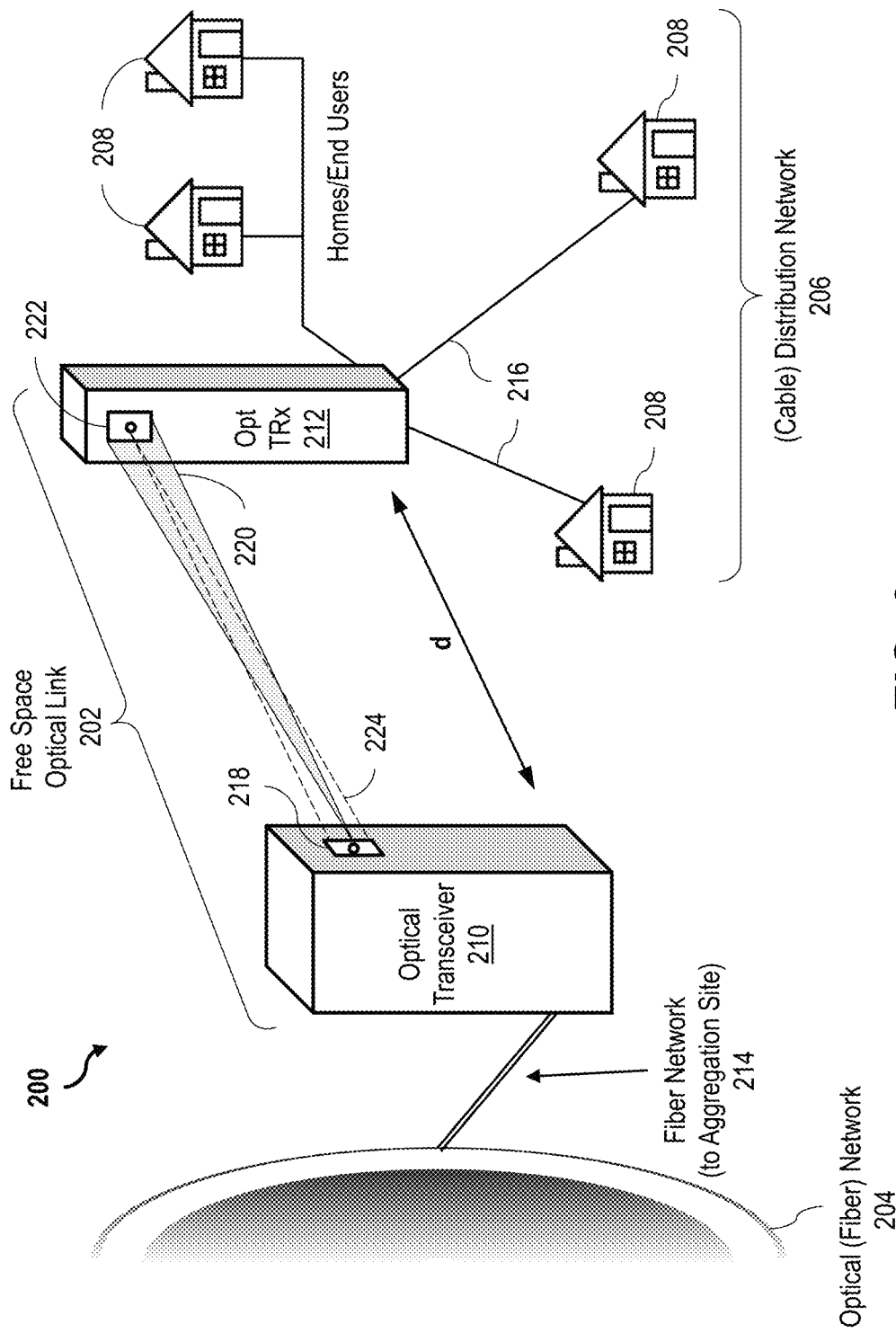
FIG. 2 is a schematic illustration of an exemplary network communication system utilizing a free space optical link.

FIG. 2 is a schematic illustration of an exemplary network communication system 200 utilizing an FSO link 202. In an exemplary embodiment, system 200 includes an optical network 204 disposed upstream of a downstream distribution network 206 in optical communication with optical network 204 through FSO link 202. In the exemplary embodiment depicted in FIG. 2, system 200 is illustrated according to a P2MP configuration, with optical network 204 represented as a fiber network (e.g., having one or more optical hubs (not separately shown)), and distribution network 206 represented as a cable distribution network supporting a plurality of end users 208 (e.g., customer premises, homes, businesses, small cells, etc.). The person of ordinary skill in the art will understand that this particular configuration is provided by way of example, and not in a limiting sense. The FSO principles described with respect to FIG. 2 are also applicable to alternative exemplary configurations of system 200, including without limitation, an access network, a data center, a hyperscaler, a PON/CPON, and/or a hybrid fiber coaxial (HFC) network, without departing from the scope herein.

In an exemplary embodiment, FSO link 202 includes a first optical transceiver 210 in optical communication with a second optical transceiver 212 across a free space distance d. For purposes of this discussion, first optical transceiver 210 may be considered the "upstream transceiver" and second optical transceiver 212 may be considered the "downstream transceiver." These labels though, are relative, and for convenience purposes only. In a bidirectional optical transmission, labels such as "upstream" and "downstream" merely indicate directionality of one transceiver with respect to the other.

In the exemplary embodiment depicted in FIG. 2, upstream transceiver 210 connects to optical network 204 by way of a fiber network 214, which may include at least one "long" optical fiber (e.g., a single mode fiber (SMF) up to 80 km in length), or multiple optical fibers connecting to an aggregation site. In a similar manner, downstream transceiver 212 connects to end users 208 of distribution network 206 by way of one or more "short" fibers 216 (e.g., typically under 5 km in length). In the case where a customer premises equipment (CPE), modem, or ONU (not separately shown) of a particular end user 208 is configured for fiber-to-the-home/premises (ftth/fttp), short fibers may provide a direct optical connection from second optical transceiver 212 to the configured device of that end user 208. In other cases, short fibers may terminate at an intervening fiber node or optical distribution center (ODC) (not shown) servicing the relevant end user 208.

In exemplary operation of system 200, upstream transceiver 210 includes a first optical emitter/detector 218 configured to collect downstream optical signals from fiber network 214, and then transmit, i.e., from an upstream emission portion (not separately illustrated) of first optical emitter/detector 218, a downstream FSO beam 220 to a detector portion (not separately illustrated) of a second optical emitter/detector 222 of downstream transceiver 212 for downstream distribution to respective end users 208. In a similar manner, downstream transceiver 212 is configured to collect upstream signals from end users 208, and then transmit, i.e., from a downstream emission portion (not separately illustrated) of second optical emitter/detector 222, an upstream FSO beam 224 to a detector portion (not separately illustrated) of first optical emitter/detector 218 for upstream delivery to fiber network 214. For purposes of this discussion, it is assumed that a clear line of sight exists between first and second optical emitters/detectors 218, 222.

In an exemplary embodiment, the downstream optical signal obtained from fiber network 214 is a high quality, narrow-band source signal substantially within a single longitudinal mode (e.g., from an ECL) such that downstream FSO beam 220 from upstream transceiver 210 enables emitting lasers (described further below with respect to FIG. 3) of downstream transceiver 212 to injection lock to the frequency of the narrow-band source signal for transmission of upstream FSO beam 224. According to this innovative FSO configuration, OIL may be effectively implemented across the free space of FSO link 202, thereby enabling use of relatively inexpensive (e.g., FP) optical light sources throughout FSO link 202 and system 200 for both upstream and downstream transmission. In a P2MP configuration, the hardware cost reduction may be dramatic, particularly in the case where up to 500 end users may communicate with a single downstream optical transceiver.

Systems and methods according to the innovative techniques of system 200 thus advantageously provide an FSO solution that, from a performance perspective, is comparable to conventional FSO techniques that require high-quality ECL sources across both ends and throughout the conventional FSO link. Due to the high cost of ECLs, such conventional high-quality FSO implementations are typically confined to P2P architectures, which may include as few as two ECLs to complete the FSO link. However, from a cost perspective, system 200 is comparable to conventional FSO systems that utilize all-FP laser sources, except for the additional hardware expense of at least one high-quality (e.g., ECL) parent laser source to which all other laser sources (e.g., as many as 500 in a P2MP optical network) may injection lock thereto as child lasers.

Although relatively inexpensive in comparison to conventional ECL-based FSO systems, the low quality and limited transmission range of conventional all-FP FSO systems have presented significant challenges to the practical utility of their implementation. These conventional challenges have been particularly pronounced with respect to distribution networks including rural geographies, which tend to include much greater numbers of end users separated by significant distances, which in turn renders it cost-prohibitive to lay optical fiber throughout such a rural network. Conventional ECL-based FSO techniques are similarly cost-prohibitive for such geographical scenarios, and conventional all-FP FSO techniques have not provided sufficient quality in these cases. According to the principles of system 200 though, a high quality and cost-effective FSO solution is provided for complex geographical scenarios.

Innovative solutions according to system 200 thus realize still further significant cost savings by eliminating the need for a great quantity of fiber/cable that would conventionally be required to span the distance d across FSO link 202. Additionally, the distance d may be optimally set according to the desired design conditions and operation of system 200. In one exemplary scenario, operational conditions of system 200 may render a shorter distance d (e.g., 1 km) desirable for a high capacity transmission beam, but longer distances d (e.g., 10 km) desirable for lower capacity transmission beams, or even tens of kilometers in the case of satellite transmissions.

Alternatively, as described further below with respect to FIGS. 3-4, operational conditions may render it desirable to implement multiple low-cost child lasers, injection-locked to a single parent source, to transmit a plurality of lower-capacity beams over longer distances d, that deliver an equivalent high-capacity signal in the aggregate. Using the OIL/COIL techniques described above, all of the multiple inexpensive child lasers across FSO link 202 are phase-synchronized to the single high-quality parent source, and thus also to each other, thereby further enabling each such child laser to function as both a transmitting laser source and a local oscillator (LO) source, particularly in the coherent detection implementation case (COIL). Furthermore, because all of the injection-locked signals are phase-synchronized, the need for digital signal processing (DSP) at the respective receiver portions of system 200 is greatly simplified.

The innovative systems and methods described herein are also of particular value for implementations with respect to optical access networks and data centers/hyperscalers. The growing number of global internet users, presently estimated to be over four billion, is driving an ever-increasing demand for bandwidth from existing data center interconnects (DCI) and optical access networks. To meet these high capacity demands, the coherent FSO solutions described herein provide significant advantages to emerging DCI and access network applications due to the superior performance realized thereby in terms of sensitivity and spectral efficiency. However, cost is still a major hurdle for large scale deployments in short-haul networks. As data centers and access networks continue to increase in scale, the present embodiments demonstrate a high-performance, scalable solution to increase the achievable bandwidth, but that does not increase increasing the associated hardware costs in the same proportion as existing conventional solutions.

For example, conventional coherent technology deployments in long-haul optical systems utilize discrete photonic and electronic components considered to be best-in-class. The short-haul optical network paradigm, on the other hand, is a different environment than the long-haul (or metro) optical network paradigm. Conventional optical network costs are primarily driven by the need for separate transmitter lasers and LOs. System 200 significantly reduces such costs by eliminating the need for a separate LO optical source. As also described above, system 200 further reduces the aggregate transmitter laser cost by utilizing injection-locked low-cost transmitter lasers (e.g., FPLDs) in place of all but one of the much more costly ECLs for each transmission source. FPLDs are further with respect to the short-haul environment, due to the less demanding optical link power budget in the short-haul optical network paradigm.

Figure 3:
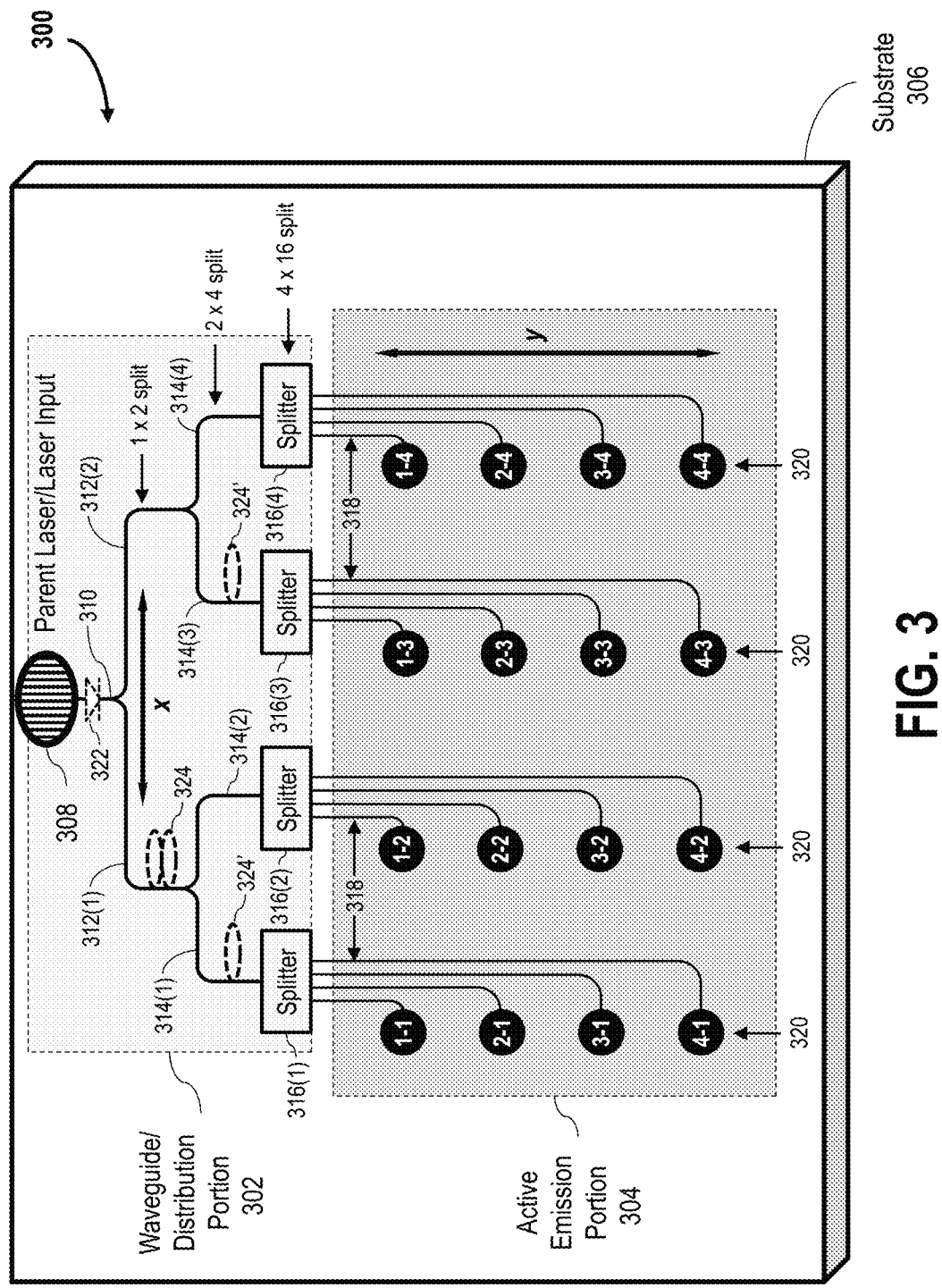
FIG. 3 is a schematic illustration depicting an exemplary optical injection locking laser array.

FIG. 3 is a schematic illustration depicting an exemplary OIL laser array 300. In the exemplary embodiment, array 300 has a generally planar topology, and includes a waveguide distribution portion 302 in optical communication with an active emission portion 304, with both portions 302, 304 formed on a single planar substrate 306. In the exemplary embodiment depicted in FIG. 3, array 300 and substrate 306 may represent a silicon on silica (SoS) single-chip fabrication.

In the exemplary embodiment, waveguide/distribution portion 302 includes a parent laser source 308 (e.g., an ECL) integrated into the chip fabrication. In an alternative embodiment, parent source 308 may represent only an optical input (e.g., an optical coupler) configured to receive a high-quality, narrow-band single longitudinal mode frequency signal from an external high-quality ECL laser source. The high-quality optical signal from parent laser source 308 is then fed into a first primary optical distribution branch 310, which itself is then split into at least two separate secondary optical branches 312(1), 312(2) in a 1×2 optical split. Optionally, each secondary optical distribution branch 312(1), 312(2) may itself be further split into two tertiary optical distribution branches 314 each, namely, a 2×4 optical split of tertiary optical distribution branches 314(1) and 314(2) following secondary optical distribution branch 312(1), and of tertiary optical distribution branches 314(3) and 314(4) following secondary optical distribution branch 312(2).

In an embodiment, each tertiary optical distribution branch 314 feeds into a respective optical splitter 316. In the exemplary embodiment depicted in FIG. 3, each splitter 316 is represented as a four-way splitter configured to separate the optical pathway input from its respective tertiary optical distribution branch 314 into four separate emission branches 318 extending toward active emission portion 304. Each emission branch 318 may then directly provide an optical input into the respective child laser 320 (16 child lasers 320, in this example, labeled 1-1 through 4-4) distributed in an array across active emission portion 304.

The person of ordinary skill in the art will understand that a 1:16 parent-to-child laser ratio, as well as a 4×4 child laser array, is provided by way of example, and is not intended to be limiting. After reading and comprehending the present specification and accompanying drawings, the person of ordinary skill the art will understand that the operational principles of the present techniques may advantageously function using a parent-to-child laser ratio as small as 1:2 (i.e., only two secondary optical distribution branches 312 feeding directly into two respective child lasers 320). Alternatively, the array of child lasers could represent a 1:4 ratio (e.g., a 1×4 or a 2×2 child laser array), a 1:8 ratio, a 1:32 ratio etc., with as many two-way splits and/or four-way splitters as practically necessary to achieve the desired symmetrical array in the x- and/or the y-directions (as shown in FIG. 3).

In an exemplary embodiment, each child laser 320 is fabricated directly on to the SoS structure of the array chip, and includes both a surface-emitting FP laser and a circulator (not separately shown). Conventional surface-emitting FP laser arrays are known in this field of art; however, such conventional FP laser arrays require E/O conversion to produce the respective optical signals from the several FP lasers, and do not provide a high quality (e.g., ECL) parent laser source (e.g., parent laser source 308) on the same array chip (e.g., array 300) to which all FP child lasers 320 may injection lock and phase-synchronize.

In some embodiments, each child laser 320 may optionally include its own modulator (not separately shown) fabricated on the array chip. In other embodiments, at least one modulator is utilized with respect to parent laser source 308, and connected child lasers 320 may simply transmit redundant splits of lower capacity beams from the same parent source, for example, where it may be desirable to transmit multiple low-capacity beams over longer distances instead of single high-capacity beams over shorter distances, as described above.

As also described above, parent laser source 308 may itself be a single high-quality laser source, such as an ECL, or may alternatively represent a passive optical element configured to receive an equivalent high-quality laser signal from an external source. Nevertheless, in both cases, the innovative architecture of array 300 represents an all-optical design topology, having a single high-quality optical source input (i.e., parent laser source 308) and a plurality of injection-locked high-quality optical source outputs (i.e., child lasers 320). This innovative design thus represents a significant improvement over conventional FSO surface-emission arrays, which require electrical source signals and E/O conversion to produce the surface-emission optical outputs. The optical-input/optical-output topology of array 300, on the other hand, represents a lower-complexity architecture that only significantly reduces implementation costs, but also improves performance throughout the entire array.

More particularly, the all-optical topology of array 300 eliminates the need for mechanical beam steering techniques that are often required in conventional FSO transmission schemes. Furthermore, because no E/O conversion is required from input to output, each surface-emitting child laser 320 represents a full transmission emission point, effectively experiencing no significant gain loss from the input of parent laser source 308. Each child laser 320 thus easily transmits at full power, subject only to the power budget of the system/FSO optical link (e.g., system 200/FSO optical link 202, FIG. 2) in which array 300 is deployed (e.g., at first or second optical transceivers 210, 212, FIG. 2).

In one exemplary scenario of the embodiment depicted in FIG. 3, parent laser source 308 may be transmitting (or be received) at +10 dBm optical power. For a 20-dB budget, this parent signal may be split 16 ways (e.g., as illustrated in FIG. 3) or more at one site, and then transmitted over free space to a remote second site with sufficient power budget. In at least one embodiment, an optional amplifier 322 may be disposed after parent laser source 308 to increase the split ratio, the number of child lasers 320 used in the array, and/or the distance d desired for FSO transport.

In some embodiments, array 300 may further include one or more controllable waveguides 324 disposed along one or more of primary optical distribution branch 310, secondary optical distribution branches 312, and/or tertiary optical distribution branches 314. Implementation of this optional component functions to not only provide non-mechanical steering capability for the respective optical signal (e.g., by introducing a phase shift to the respective optical signal on that branch), but also functions to adjust for irregularities that may occur in the fabrication process of array 300. For example, two symmetrical branches from the same split in distribution portion 302 may not be precisely the same length. Implementation of at least one controllable waveguide 324 on one or both branches of that particular split further enables introduction of a delay to the respective optical signal to compensate for mismatches in the branch fabrication lengths.

Controllable waveguides 324 may, for example, include conventional electrical elements, such as a heater pad, to facilitate introduction of phase shifts and/or delays. Nevertheless, it should be noted that such electrical components merely guide the all-optical signals through array 300, and do not perform any E/O or O/E conversion on such signals. Where controllable waveguide 324 is implemented to function as a phase element, it may be desirable to dispose a particular controllable waveguide 324 on a given branch 310, 312, 314 before a particular split within distribution portion 302, such that each subsequent branch stemming from that particular split will be subject to the same effect of that particular phase element. Alternatively, or additionally, a particular controllable waveguide 324 may be disposed on a given branch 312, 314 for individual phase control of that given branch separate from other branches from the same split.

According to the versatile all-optical architecture of array 300, a number of different use cases may be implemented to achieve significant improvements in both the reliability and the data rate of FSO transport. For example, in a first exemplary use case, the plurality of phase-synchronized and wavelength-locked child lasers 320 may be configured to transmit the same high data rate signals (e.g., 10 Gb/s) from each such surface emitter. According to this technique, multiple signal copies may be generated from the several child lasers 320 to provide both redundancy and simplified (i.e., less resource-intensive) joint processing of the received FSO signals.

Alternatively, in a second exemplary use case, the plurality of phase-synchronized and wavelength-locked child lasers 320 may be configured to transmit different low-data rate signals from each such surface emitter. According to this alternative technique, multiple low-data rate tributary signals (e.g., 1 Gb/s) may be generated from the several child lasers 320, which will exhibit significantly higher tolerance of impairments across the FSO link due to the lower data rate, yet nevertheless still provide simplified joint processing due to the phase-synchronization and wavelength-locking. In some instances of this second exemplary use case, the received FSO signals may be easily combined or aggregated to achieve high capacity FSO transport.

In an exemplary embodiment, either exemplary use case described medially above may further advantageously implement coherent detection to realize proved receiver sensitivity. Through such implementation of coherent detection technology, each child laser 320 is enabled to function as both a transmitting laser source and an LO source, thereby eliminating the conventional need for separate source components. Accordingly, in a COIL implementation of array 300, multiple low-cost FP child lasers 320 are each enabled to realize performance quality comparable to the single parent laser 308, and without the need for additional LO hardware. According to this innovative configuration, the increased cost of a single high-quality parent laser 308 may be more easily spread across the multiple high-performing, but low-cost, child lasers 320. Indeed, the individual cost increase to each child laser 320 from the single parent laser 308 is reduced as more child lasers 320 are implemented in array 300. For example, at present, the cost of an ECL is typically at least 100 times greater than the cost of an FPLD.

Thus, in effect, by implementing array 300 into an optical transceiver of an FSO link (e.g., upstream transceiver 210 and/or downstream transceiver 212 of FSO link 202, FIG. 2), after propagation of the resulting FSO beams (e.g., downstream beam 220/upstream beam 224, FIG. 2) through atmospheric turbulence, the optical signals received at each respective receiver aperture may vary randomly over time. However, according to the present embodiments, because all of the individual child laser sources 320 are injection-locked and phase-synchronized to the same parent laser source 308, the received signals may be jointly processed at the respective receiver to easily recover the original transmitted signal. As also described above, in some cases, it may be desirable to disaggregate the signal into multiple tributary signal streams, corresponding to the number of surface-emitting array elements 320, to further mitigate air/atmosphere transmission impairments. Furthermore, the implementation of controllable waveguides 324 serves to provide a non-mechanical adaptive steering and alignment control system that further increases the accuracy of such array-based FSO connections.

The systems and methods described herein thus advantageously expand upon the OIL/COIL innovations previously developed by the present inventors, and which are incorporated by reference herein. The present FSO techniques, for example, may be effectively implemented as cost-effective replacements for existing optical fiber/fiber cable plants, and/or as cost-effective alternatives to complex geographies or topologies where the deployment of additional fiber is cost-prohibitive (e.g., in rural deployment schemes) or space-limited (e.g., a DCI).

Additionally, in many optical access network implementations, a single-fiber topology is deployed. That is, both downstream and upstream transmission may occur over the same single strand of fiber (e.g., SMF). In the case of FSO transmission, both such directional transmissions are sent over the same FSO communication medium (e.g., air, space, atmosphere, etc.). The present embodiments are therefore particularly useful for such bidirectional applications, including full-duplex (FDX) simultaneous bidirectional coherent transmission schemes, in that the present systems and methods may advantageously operate agnostically to the direction of transmission. In this regard, such terms as "downstream" and "upstream" are relative, and merely indicate one transceiver as a reference point with respect to a different transceiver at the other end of the optical communication medium.

Accordingly, the architecture of array 300 described herein, by avoiding the need for conventional compensation hardware, may therefore be fabricated less expensive and more compact physical device in comparison with conventional FSO schemes and devices. The novel and advantageous all-optical design of array 300 thus further enables adaptable multi-wavelength emission with simplicity, reliability, and low cost. That is, because all child lasers 320 in array 300 are phase-synchronized and wavelength-locked to parent laser source 308, child lasers 320 remain agnostic to any changes to the frequency/wavelength of the parent signal. As the parent signal from parent laser source 308 changes, all child lasers 320 will change accordingly with the changes to the parent signal.

The person of ordinary skill the art will further understand that the innovative OIL/COIL FSO principles are not limited to the architectural design described above with respect to FIG. 3, which is provided by way of example. Other optical-input/optical-output OIL/COIL-based architectural configurations may be realized without departing from the scope herein. One such alternative architectural configuration is described further below with respect to FIG. 4.

Figure 4:
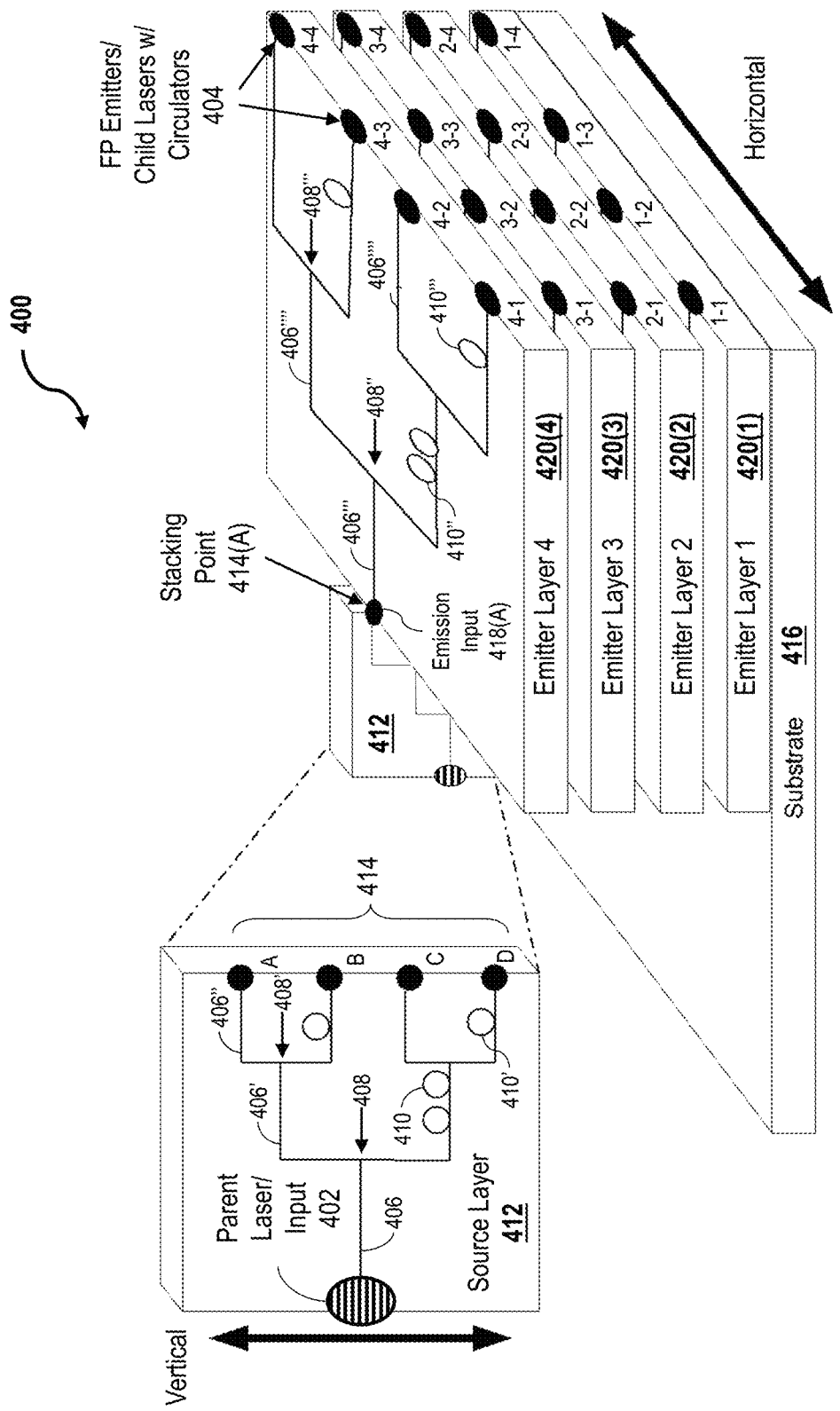
FIG. 4 is a schematic illustration depicting an exemplary optical injection locking laser array stack.

FIG. 4 is a schematic illustration depicting an exemplary OIL laser array stack 400. Array stack 400 is similar, in a number of aspects, to array 300, FIG. 3, and common elements therebetween are referred to using similar labels. For example, array stack 400 includes a single parent laser source 402 as an optical input to array stack 400, a plurality of child lasers 404 as optical outputs from array stack 400, and a plurality of optical distribution branches 406, optical splits 408, and controllable waveguides 410 disposed therebetween. Unless described herein to the contrary, these several elements may be considered to have similar structure and/or function to elements of array 300, FIG. 3, having the same labels.

Additionally, for ease of comparison with array 300, FIG. 3, array stack 400 is illustrated in an architectural configuration resulting in a similar 1:16 parent-to-child laser ratio, as well as a 4×4 output array of child lasers 404. The person of ordinary skill in the art, however, will understand that this particular configuration is provided by way of example, and not in a limiting sense. Other architectural configurations for array stack 400 may be realized, according to the principles described above and further below, without departing from the scope herein.

Array stack 400 structurally differs though, from array 300, FIG. 3. That is, instead of having all elements fabricated on a single planar layer of a substrate (e.g., substrate 306, FIG. 3), array stack 400 alternatively distributes a number of elements across several fabricated layers disposed in parallel with, or perpendicularly to, one another. In the exemplary embodiment depicted in FIG. 4, parent laser source 402 is fabricated on a source layer 412. Source layer 412 has a substantially similar topological configuration to waveguide/distribution portion 302 of array 300, FIG. 3, except that the several optical distribution branches 406 and optical splits 408 of source layer 412 lead to a plurality of stacking points 414 instead of respective splitters (e.g., splitters 316, FIG. 3).

Source layer 412 also differs from waveguide/distribution portion 302, in that source layer 412 is disposed vertically with respect to a horizontal plane of an underlying substrate 416. The person of ordinary skill the art will understand that terms such as "vertical" and "horizontal" are used for reference purposes only, and merely describe the relative disposition of source layer 412 perpendicular to substrate 416. For example, utilizing an arbitrary Cartesian coordinate system, substrate 416 may be thought to be disposed substantially parallel to the x-y plane, whereas source layer 412 may be thought to be disposed substantially perpendicularly to substrate 416, namely, in one of the x-z or y-z planes.

In the exemplary embodiment depicted in FIG. 4, each stacking point 414 of source layer 412 connects directly to an emission input 418 of a respective substantially planar emitter layer 420 formed on top of, and parallel to, substrate 416. In the exemplary embodiment, the number of emitter layers 420 (4, in this example) corresponds to a number of stacking points 414, and the respective emitter layers 420 may be successively formed on top of one another, and vertically spaced such that the respective emission input 418 of each emitter layer 420 aligns with a particular stacking point 414 of source layer 412. In some embodiments, additional substrate layers (not shown) may be fabricated between successive emitter layers 420 to control the physical spacing therebetween and resultant alignment with respective stacking points 414.

Array stack 400 thus represents an effective alternative solution to achieve a similar injection-locked output array of low-cost optical FP emitter child lasers 404 using a single parent laser input 402. This alternative configuration may be of particular value in applications where steerability is of greater concern. According to the innovative configuration of array stack 400, vertical steerability may be effectively controlled by the disposition of stacking points 414, and horizontal steerability may be controlled by the functioning of controllable waveguides 410", 410'" disposed within the respective emitter layers 420.

Array stack 400 may also provide a useful solution where it is more desirable to fabricate FP emitter child lasers in a linear array for an emitter layer (i.e., 1×2, 1×4, 1×8, 1×16, etc.), as opposed to a planar array of surface emitters having at least a 2×2 array configuration on the same layer. It should be noted though, that the output array of FP emitter child lasers according to array stack 400 will have a minimum 2×2 configuration. The unique construction aspects of array stack 400 enable additional versatility to the structural design approach. Nevertheless, and similar to array 300, FIG. 3, each injection-locked child laser 404 of array stack 400 demonstrates the high performance and full power transmission from parent laser source 402, with no significant gain lost from input to output.

Exemplary OIL/COIL applications for FSO transport are described above by way of example, and not in a limiting sense. Additional OIL implementations may be utilized instead of, or in addition to, the foregoing FSO embodiments without departing from the scope herein. Examples of such complementary OIL implementations are described in greater detail in U.S. Pat. No. 11,115,126, issued Sep. 7, 2021, in U.S. Pat. No. 10,965,393, issued Mar. 30, 2021, U.S. Pat. No. 10,623,104, issued Apr. 14, 2020, U.S. Pat. No. 10,944,478, issued Mar. 9, 2021, and in co-pending U.S. patent application Ser. No. 17/187,237, filed Feb. 26, 2021. The disclosures of all of these previous references are incorporated by reference herein in their entireties.

The systems and methods herein are described, by way of example and not in a limiting sense, with respect to an ECL for the parent laser source(s) and FP lasers as the child laser emitters. Other types of optical sources though, may be used for the respective parent and child lasers without departing from the scope herein. For example, a distributed feedback (DFB) laser may be utilized to provide a high-quality source signal. Similarly, other types of inexpensive optical emitters, such as LEDs and/or vertical-cavity surface-emitting lasers (VCSELs) may be implemented for injection-locking to the high-quality parent signal.

Furthermore, the multiple FSO OIL/COIL embodiments described herein provide additional utility for both coherent and non-coherent detection systems, as well as for both FDX and non-FDX optical networks or PONs, in both uplink and downlink transmissions, and for various modulations (e.g., QPSK, 16QAM, etc.). According to the present disclosure, the innovative OIL/COIL-based FSO arrays further enable their utilization as dual-polarization optical transmitters. The present systems and methods are thus particularly beneficial for longhaul and shortreach applications to significantly reduce the cost of electronic hardware, while also rendering the overall network system architecture more compact and versatile.

The present systems and methods therefore further improve upon existing solutions to the conventional OIL schemes created by the present inventors. The present embodiments may therefore be cost-effectively implemented within coherent DWDM-PON system architectures for access networks in a manner similar to such previous solutions, as an alternative to the physical plant of optical fiber as an optical communication medium.

The present systems and methods thus achieve more efficient transmission of wavelengths through FSO media, thereby increasing the capacity of transmitted data, but at lower power and hardware cost, an increased receiver sensitivity in coherent deployments, and with a reduction in dispersion, and the need for DSP compensation and error correction. The person of ordinary skill in the art will understand that the principles described herein are particularly applicable to networks employing FSO transmission or other wireless technologies, including data centers and/or the DCI paradigm, namely, for both intra- and inter-data center connections.

Exemplary embodiments of OIL-based FSO communication systems and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other optical networks utilizing fiber and/or coaxial transmission at the end user stage.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An optical emission array, comprising:
a substrate disposed horizontally along a horizontal plane defined by a virtual x-axis and a virtual y-axis;
a waveguide distribution portion disposed in a vertical direction defined by a virtual z-axis substantially perpendicular to the horizontal plane, the waveguide distribution portion including (a) an optical input configured to provide a parent laser source for the optical emission array, and (b) first and second waveguide optical distribution branches (i) disposed parallel to one another in the vertical direction from the substrate, and (ii) connecting with first and second waveguide distribution stacking points, respectively; and
first and second active emission layers disposed horizontally parallel with the substrate, wherein the second active emission layer is disposed farther from the substrate, in the vertical direction, than the first active emission layer,
wherein the first active emission layer includes (a) a first emission stacking point connecting with the first waveguide distribution stacking point of the waveguide distribution portion, and (b) a plurality of first child laser emitters, injection-locked to the parent laser source, and disposed parallel to one another in a horizontal direction along the virtual x-axis of the first active emission layer, and
wherein the second active emission layer includes (a) a second emission stacking point connecting with the second waveguide distribution stacking point of the waveguide distribution portion, and (b) a plurality of second child laser emitters each injection-locked to the parent laser source, and disposed parallel (i) to one another in the horizontal direction along the virtual x-axis, and (ii) to the plurality of first child lasers in the vertical direction along the virtual z-axis, such that the pluralities of first and second child lasers form a vertically x-z planar array.

2. The optical emission array of claim 1, wherein the optical input is configured to receive a high-quality, narrow-band, single longitudinal mode frequency signal from an external laser source.

3. The optical emission array of claim 1, wherein the optical input comprises the parent laser source.

4. The optical emission array of claim 3, wherein the parent laser source includes an external cavity laser (ECL) configured to generate a high-quality, narrow-band, single longitudinal mode frequency signal.

5. The optical emission array of claim 4, wherein the parent laser source further includes a modulator in operable communication with the ECL.

6. The optical emission array of claim 1, wherein the pluralities of first and second child laser emitters include at least one of an LED, a Fabry Perot (FP) surface emitter, an FP laser diode (FPLD), and a vertical-cavity surface-emitting laser (VCSEL).

7. The optical emission array of claim 1, wherein the pluralities of first and second child laser emitters include an optical circulator in optical communication with the first or second emission stacking points.

8. The optical emission array of claim 7, wherein the pluralities of first and second child laser emitters include a modulator in operable communication with the respective optical circulator.

9. The optical emission array of claim 1, wherein the at least two child laser emitters each have a resonator frequency injection locked to a primary frequency of a single longitudinal mode corresponding to the parent laser source.

10. The optical emission array of claim 1, wherein the input and the first and second waveguide optical distribution branches are also disposed in the vertical direction extending away from a surface of the substrate.

11. The optical emission array of claim 10, further comprising a first controllable distribution waveguide disposed along at least one waveguide distribution branch of the first and second waveguide optical distribution branches.

12. The optical emission array of claim 11, wherein the first controllable distribution waveguide is configured to introduce a delay to the at least one waveguide distribution branch between the optical input and one of the first and second waveguide distribution stacking points.

13. The optical emission array of claim 12, wherein the introduced delay corresponds to a difference in length of the at least one waveguide distribution branch with respect to another waveguide distribution branch of the at least two first and second waveguide optical distribution branches.

14. The optical emission array of claim 11, wherein the controllable waveguide is configured as a phase element.

15. The optical emission array of claim 14, wherein the controllable waveguide comprises a heater pad.

16. The optical emission array of claim 1, wherein the substrate comprises a silicon on silica (SoS) construction.

17. The optical emission array of claim 1, wherein the first active emission layer further includes (c) first and second optical emission branches disposed in the horizontal direction in an x-y plane with respect (i) to one another, and (ii) to a surface of the substrate.

18. The optical emission array of claim 17, further comprising a first controllable emission waveguide disposed along at least one optical emission branch of the first and second optical emission branches.

19. The optical emission array of claim 18, wherein the first controllable emission waveguide is configured to introduce a delay to the at least one optical emission branch between the first emission stacking point and at least one first child laser of the plurality of first child lasers.

20. The optical emission array of claim 1, wherein the first and second waveguide optical distribution branches are disposed parallel to one another in a y-z plane.

* * * * *